United States Patent
Ahn et al.

(10) Patent No.: US 11,696,398 B2
(45) Date of Patent: Jul. 4, 2023

(54) ANODIC ALUMINUM OXIDE STRUCTURE, PROBE HEAD HAVING SAME, AND PROBE CARD HAVING SAME

(71) Applicant: POINT ENGINEERING CO., LTD., Asan-si (KR)

(72) Inventors: Bum Mo Ahn, Suwon-si (KR); Seung Ho Park, Hwaseong-si (KR); Dong Eun Lee, Pyeongtaek-si (KR)

(73) Assignee: POINT ENGINEERING CO., LTD.

( * ) Notice: Subject to any disclaimer, the term of this patent is extended or adjusted under 35 U.S.C. 154(b) by 170 days.

(21) Appl. No.: 17/209,203

(22) Filed: Mar. 22, 2021

(65) Prior Publication Data

US 2021/0307160 A1  Sep. 30, 2021

(30) Foreign Application Priority Data

Mar. 27, 2020 (KR) ........................ 10-2020-0037824

(51) Int. Cl.
*H05K 1/03* (2006.01)
*H05K 1/11* (2006.01)
*G01R 1/073* (2006.01)

(52) U.S. Cl.
CPC ....... *H05K 1/0306* (2013.01); *G01R 1/07378* (2013.01); *H05K 1/115* (2013.01); *H05K 2201/09618* (2013.01)

(58) Field of Classification Search
CPC ............... H05K 1/0306; H05K 1/115; H05K 2201/09618; G01R 1/07378; G01R 1/07314; G01R 1/07357; G01R 1/07371; G01R 3/00; G01R 1/0735; G01R 1/07307; G01R 31/2863; G01R 31/2886
See application file for complete search history.

(56) References Cited

U.S. PATENT DOCUMENTS

2004/0036493 A1*  2/2004  Miller ................ G01R 31/2889
                                                                324/754.14

FOREIGN PATENT DOCUMENTS

| JP | H0693431 B2 | * | 11/1994 | |
| JP | H0936122 A | * | 2/1997 | |
| JP | H10121292 A | * | 5/1998 | |
| JP | 2009224146 A | * | 10/2009 | ........... G01R 1/0735 |
| JP | 2011181895 A | * | 9/2011 | ............. B23K 20/04 |
| JP | 5337341 B2 | * | 11/2013 | ............... G01R 3/00 |
| JP | 5337341 B2 | | 11/2013 | |
| KR | 20100135746 A | * | 12/2010 | |
| KR | 101823527 B1 | * | 1/2018 | |

OTHER PUBLICATIONS

Kato et al. "Photosensitive-polyimide based method for fabricating various neural electrode architectures", Frontiers in Neuroengineering, Jun. 2012 (Year: 2012).*

* cited by examiner

*Primary Examiner* — Alexander Satanovsky
*Assistant Examiner* — Asm Fakhruddin
(74) *Attorney, Agent, or Firm* — Renaissance IP Law Group LLP (57) ABSTRACT

Proposed are an anodic aluminum oxide structure made of anodic aluminum oxide, a probe head having the same, and a probe card having the same. More particularly, proposed are an anodic aluminum oxide structure that has a fine size and pitch guide hole and facilitates insertion of a probe, a probe head having the same, and a probe card having the same.

6 Claims, 7 Drawing Sheets

ANODIC ALUMINUM OXIDE STRUCTURE, PROBE HEAD HAVING SAME, AND PROBE CARD HAVING SAME

CROSS REFERENCE TO RELATED APPLICATION

The present application claims priority to Korean Patent Application No. 10-2020-0037824, filed Mar. 27, 2020, the entire contents of which is incorporated herein for all purposes by this reference.

BACKGROUND

1. Technical Field

The present disclosure relates to an anodic aluminum oxide structure made of anodic aluminum oxide, a probe head having the same, and a probe card having the same.

2. Description of the Related Art

In general, a semiconductor manufacturing process largely includes a fabrication process for forming a pattern on a wafer, an electrical die sorting (EDS) process for testing electrical characteristics of respective chips constituting the wafer, and an assembly process for assembling the wafer on which a pattern is formed to individual chips.

Here, the EDS process is performed to detect defective chips among the chips constituting the wafer. In the EDS process, a probe card which applies electrical signals to the chips constituting the wafer and determines whether the chips are defective on the basis of signals checked from the applied electrical signals is mainly used.

A probe card is a device that connects a semiconductor wafer (or a semiconductor device) and test equipment to test the operation of the semiconductor device, and serves to transmit electricity while connecting probes provided on the probe card to a wafer, and then sort defective semiconductor chips on the basis of feedback signals received thereby.

The probe card used for an electrical test of the semiconductor device may include a circuit board, an interposer, a space transformer, a probe head, and probes. In the probe card, an electrical path is provided through the circuit board, the interposer, the space transformer, and the probe head, and a pattern of a wafer is tested by the probes that directly contact the wafer.

The probe head supports the probes passing through the space transformer, and serves to prevent an electrical short due to contact between adjacent probes.

Specifically, the probe head includes at least one guide plate, and the probes are inserted into guide holes formed in the guide plate and guided toward the wafer.

An example of such a guide plate for a probe card is disclosed in Japanese Patent No. 5337341 B2.

A related-art guide plate for a probe card is made of a ceramic material.

In the ceramic guide plate, through-holes are mainly formed using a mechanical processing method. Specifically, the through-holes of the ceramic guide plate for the probe card are formed using a drill or a laser beam.

However, the ceramic guide plate as described above has a low transmittance and thus is problematic in that it may be difficult to insert probes, and due thereto, manufacturing time and manufacturing cost of the probe card may increase.

In addition, the through-holes formed using mechanical processing are required to be formed in consideration of mechanical errors, and thus are difficult to form with a fine size and pitch. With the recent trend toward miniaturization of semiconductor devices, the size and pitch of electrodes of the semiconductor device have become finer, and this has led to a demand for reducing the thickness of probes of a probe card. Accordingly, there is a demand for making through-holes having the probes therein finer in size and pitch. However, it is difficult to meet such a demand with the ceramic guide plate due to a difficulty in realizing a fine size and pitch of the through-holes.

The foregoing is intended merely to aid in the understanding of the background of the present disclosure, and is not intended to mean that the present disclosure falls within the purview of the related art that is already known to those skilled in the art.

SUMMARY

Accordingly, the present disclosure has been made keeping in mind the above problems occurring in the related art, and an objective of the present disclosure is to provide an anodic aluminum oxide structure that has a fine size and pitch guide hole and facilitates insertion of a probe, to provide a probe head having the same, and to provide a probe card having the same.

In order to achieve the above objective, according to one aspect of the present disclosure, there is provided a probe head, including: an upper guide plate having an upper guide hole; and a lower guide plate having a lower guide hole, wherein each of a plurality of probes may sequentially pass through the upper guide hole and the lower guide hole, at least one of the upper guide plate and the lower guide plate may be composed of an anodic aluminum oxide sheet, and the anodic aluminum oxide sheet may include a porous layer having pores and a barrier layer provided on at least one surface of the porous layer and having no pores.

Furthermore, a thickness of the barrier layer may be larger than that of a partition wall between adjacent pores of the porous layer.

Furthermore, the at least one of the upper guide plate and the lower guide plate may be formed by stacking a plurality of anodic aluminum oxide sheets.

Furthermore, the anodic aluminum oxide sheets may be joined to each other by a junction part.

Furthermore, the junction part may be a photosensitive film capable of lithography.

According to another aspect of the present disclosure, there is provided a probe card, including: a space transformer having a probe connection pad electrically connected to each of a plurality of probes; and a probe head provided below the space transformer, wherein the probe head may include: an upper guide plate having an upper guide hole; and a lower guide plate having a lower guide hole, wherein each of the plurality of probes may sequentially pass through the upper guide hole and the lower guide hole, at least one of the upper guide plate and the lower guide plate may be composed of an anodic aluminum oxide sheet, and the anodic aluminum oxide sheet may include a porous layer having pores and a barrier layer provided on at least one surface of the porous layer and having no pores.

According to still another aspect of the present disclosure, there is provided an anodic aluminum oxide structure, including: an anodic aluminum oxide sheet including a porous layer having pores, and a barrier layer provided on at least one surface of the porous layer and having no pores, wherein a thickness of the barrier layer may be larger than that of a partition wall between adjacent pores of the porous layer.

As described above, in the anodic aluminum oxide structure, the probe head having the same, and the probe card having the same according to the present disclosure, by provision of the guide hole having a fine size and pitch, it is possible to facilitate the insertion of the probe.

In addition, in the anodic aluminum oxide structure, the probe head having the same, and the probe card having the same according to the present disclosure, by the provision of the barrier layer, it is possible to improve surface strength, and prevent a problem of warpage deformation due to heat under a high-temperature atmosphere.

In addition, in the anodic aluminum oxide structure, the probe head having the same, and the probe card having the same according to the present disclosure, it is possible to prevent a problem of particle being generated during the insertion of the probe.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

Contents of the description below merely exemplify the principle of the present disclosure. Therefore, those of ordinary skill in the art may implement the theory of the present disclosure and invent various apparatuses which are included within the concept and the scope of the present disclosure even though it is not clearly explained or illustrated in the description. Furthermore, in principle, all the conditional terms and embodiments listed in this description are clearly intended for the purpose of understanding the concept of the present disclosure, and one should understand that the present disclosure is not limited the exemplary embodiments and the conditions.

The above described objectives, features, and advantages will be more apparent through the following detailed description related to the accompanying drawings, and thus those of ordinary skill in the art may easily implement the technical spirit of the present disclosure.

The embodiments of the present disclosure will be described with reference to cross-sectional views and/or perspective views which schematically illustrate ideal embodiments of the present disclosure. For explicit and convenient description of the technical content, thicknesses and widths of members and regions in the figures may be exaggerated. Therefore, variations from the shapes of the illustrations as a result, for example, of manufacturing techniques and/or tolerances, are to be expected.

In addition, a limited number of holes are illustrated in the drawings. Thus, the embodiments should not be construed as limited to the particular shapes of regions illustrated herein but are to include deviations in shapes that result, for example, from manufacturing.

In describing various embodiments, the same reference numerals will be used throughout different embodiments and the description to refer to the same or like elements or parts. In addition, the configuration and operation already described in other embodiments will be omitted for convenience.

Hereinafter, exemplary embodiments of the present disclosure will be described in detail with reference to the accompanying drawings.

Figure 1:
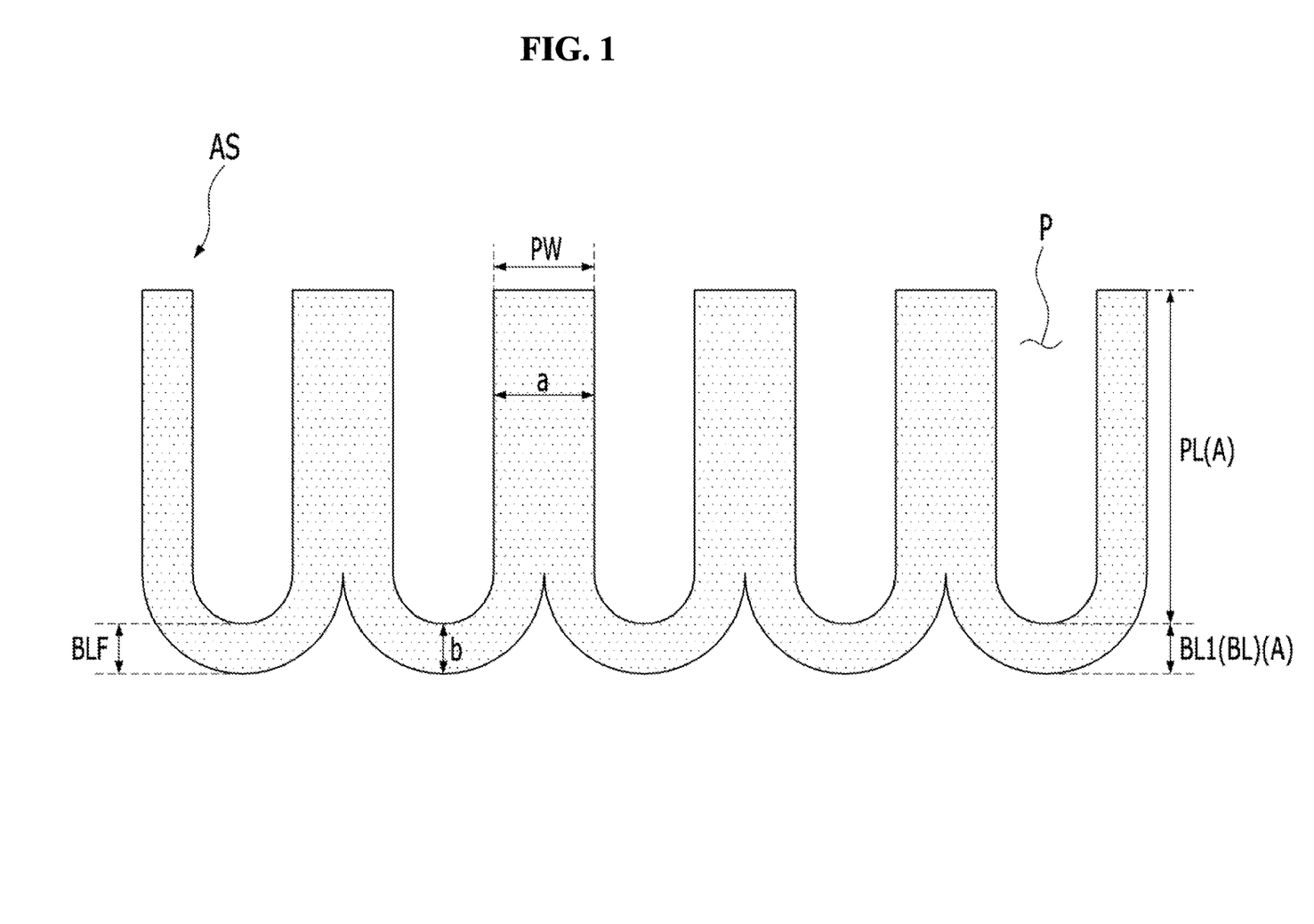
FIG. 1 is a view schematically illustrating an anodic aluminum oxide structure according to a first exemplary embodiment of the present disclosure.
Figure 2A:
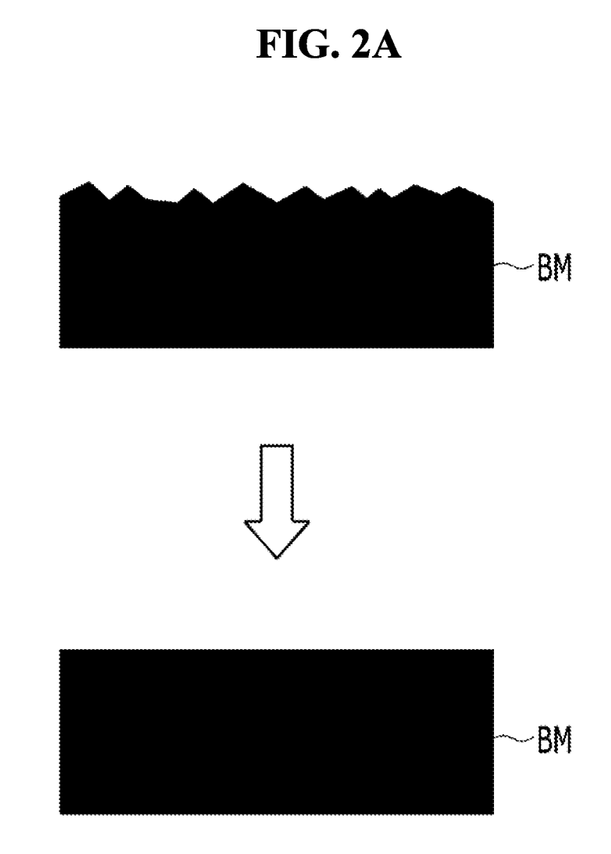
FIGS. 2A and 2B are views schematically illustrating a method of manufacturing the anodic aluminum oxide structure according to the first exemplary embodiment of the present disclosure.
Figure 2B:
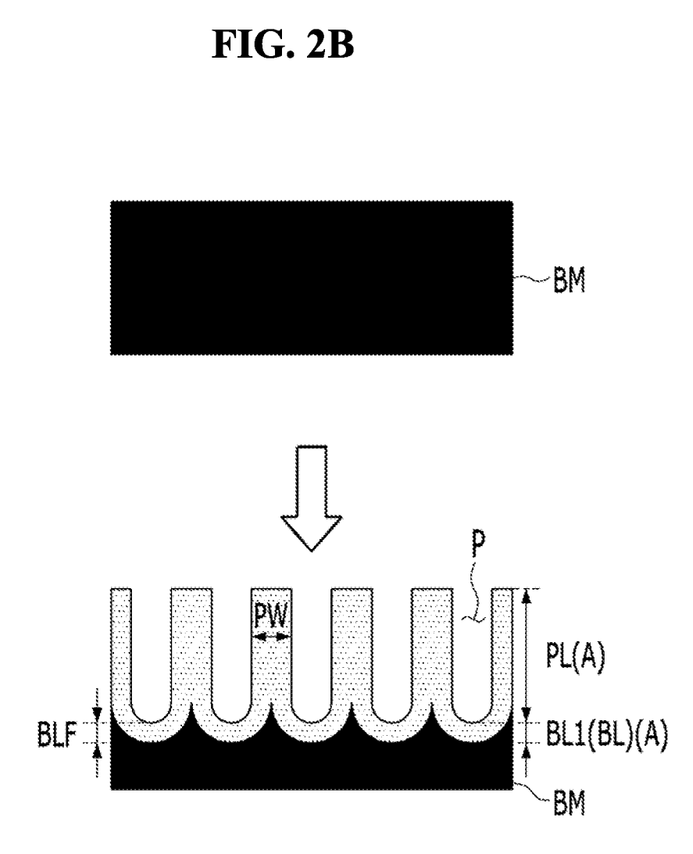

Anodic Aluminum Oxide Structure According to a First Exemplary Embodiment of the Present Disclosure FIG. 1 is an enlarged view illustrating at least a part of an anodic aluminum oxide sheet AS of a first embodiment constituting the anodic aluminum oxide structure according to the first exemplary embodiment of the present disclosure, and FIGS. 2A and 2B are views schematically illustrating a process of manufacturing the anodic aluminum oxide sheet AS of the first embodiment constituting the anodic aluminum oxide structure according to the first exemplary embodiment of the present disclosure.

The anodic aluminum oxide structure according to the first exemplary embodiment of the present disclosure may include the anodic aluminum oxide sheet AS of the first embodiment that includes a porous layer PL having pores P and a barrier layer BL provided on at least one surface of the porous layer PL and having no pores P. A first anodic aluminum oxide sheet AS1 may be formed by fabricating anodic aluminum oxide A through an anodization process of a first embodiment. The anodic aluminum oxide A fabricated through the anodization process of the first embodiment may include a porous layer PL having pores P and a barrier layer BL having a first barrier part BL1 formed by the anodization process of the first embodiment.

As illustrated in FIGS. 2A and 2B, the anodic aluminum oxide sheet AS of the first embodiment constituting the anodic aluminum oxide structure according to the first exemplary embodiment of the present disclosure may be fabricated by the following process of fabricating an anodic aluminum oxide A of a first embodiment.

First, as illustrated in FIG. 2A, an aluminum base material BM is provided, and then electropolishing may be performed on a surface of the aluminum base material BM. As illustrated in FIG. 2A, the aluminum base material BM may be provided in a form in which the surface thereof is uneven. An electropolishing process may be performed on the surface of the aluminum base material BM. The aluminum base material BM having been subjected to the electropolishing process may have an even surface.

Then, as illustrated in FIG. 2B, a process of anodizing the aluminum base material BM having been subjected to electropolishing may be performed. In the anodization process of the first embodiment, a first electrolyte solution may be used. The first electrolyte solution may be at least one of sulfuric acid, oxalic acid, and phosphoric acid.

Specifically, the anodization process of the first embodiment may be performed using sulfuric acid. In this case, the anodization process may be performed by immersing the aluminum base material BM in 1 M (mol) sulfuric acid and applying a voltage of 20 V at an electrolysis temperature of 5° C.

Alternatively, the anodization process of the first embodiment may be performed using oxalic acid. In this case, the anodization process may be performed by immersing the aluminum base material BM in 0.3 M oxalic acid and applying a voltage of 40 V at an electrolysis temperature of 5° C.

Alternatively, the anodization process of the first embodiment may be performed using phosphoric acid. In this case, the anodization process may be performed by immersing the aluminum base material BM in 0.25 M phosphoric acid and applying a voltage of 100 V at an electrolysis temperature of 5° C.

As described above, the anodization process of the first embodiment may be performed under different anodization conditions (specifically, the reference of M, electrolysis temperature, and voltage) depending on the type of the first electrolyte solution. However, the first electrolyte solution may commonly have a pH of equal to or less than 5.

The anodization of the aluminum base material BM using at least one of the above-described first electrolyte solutions forms the anodic aluminum oxide A consisting of aluminum oxide ($Al_2O_3$) on the surface of the aluminum base material BM. The anodic aluminum oxide 13 is divided into the porous layer PL having the pores P formed therein and the barrier layer BL having no pores P formed therein.

The barrier layer BL may be provided by forming the first barrier part BL1 on the aluminum base material BM by the first electrolyte solution. The barrier layer BL is provided on at least one surface of the porous layer PL. In the anodic aluminum oxide sheet AS of the first embodiment constituting the anodic aluminum oxide structure according to the first exemplary embodiment of the present disclosure with reference to FIGS. 1, 2A, and 2B, as an example, the barrier layer BL may be positioned on the aluminum base material BM, and the porous layer PL may be positioned on the barrier layer BL.

Specifically, when anodizing the aluminum base material BM, the barrier layer BL may be firstly generated. The barrier layer BL is formed to have a thickness b in a range of equal to or greater than several tens nanometers (nm) to equal to or less than several micrometers (μm). In this case, the first barrier part BL1 formed by the first electrolyte solution may be formed to have a thickness b that is thinner than a thickness a of a partition wall PW formed between each of the pores P, within the range of the thickness b of the barrier layer BL. When the barrier layer BL reaches the predetermined thickness b, the porous layer PL is formed. The porous layer PL is formed to have a thickness in a range of equal to or greater than several tens nanometers (nm) to equal to or less than several hundreds micrometers (μm). Each of the pores P included in the porous layer PL is formed to have a diameter in a range of equal to or greater than several nanometers (nm) to equal to or less than several hundreds nanometers (nm). The pores P may be formed with a predetermined pitch interval, and the partition wall PW having a predetermined thickness a may be formed between each of the pores P.

As illustrated in FIGS. 1, 2A, and 2B, the thickness a of the partition wall PW between each of the pores P of the anodic aluminum oxide sheet AS of the first embodiment fabricated by the anodization process of the first embodiment may be larger than the thickness b of the barrier layer BL. Specifically, the thickness a of the partition wall PW between each of the pores P of the anodic aluminum oxide sheet AS of the first embodiment may be larger than the thickness b of the first barrier part BL1.

Then, in a state in which the anodic aluminum oxide A having the barrier layer BL and the porous layer PL is formed on the surface of the aluminum base material BM, when the aluminum base material BM is removed, only the anodic aluminum oxide A consisting of aluminum oxide ($Al_2O_3$) remains.

As illustrated in FIG. 1, the anodic aluminum oxide sheet AS of the first embodiment may have a structure in which the porous layer PL is positioned on or under the barrier layer BL, so that upper and lower surfaces of the anodic aluminum oxide sheet AS are asymmetrical.

The anodic aluminum oxide structure according to the first exemplary embodiment of the present disclosure may be configured as a single anodic aluminum oxide structure in which the anodic aluminum oxide sheet AS of the first embodiment forms a structure alone.

Alternatively, the anodic aluminum oxide structure according to the first exemplary embodiment of the present disclosure may be configured as a laminated anodic aluminum oxide structure in which a plurality of anodic aluminum oxide sheets AS of the first embodiment are provided to form a structure.

The porous layer PL and the barrier layer BL may have a difference in density due to the presence or absence of the pores P. The barrier layer BL is a region where no pores P exist and thus may have a relatively higher density than the porous layer PL. Therefore, when used as a configuration requiring a high degree of surface strength, the anodic aluminum oxide structure according to the first exemplary embodiment of the present disclosure may be configured as the laminated anodic aluminum oxide structure in which the barrier layer BL of each of the anodic aluminum oxide sheets AS of the first embodiment forms a surface of the structure.

As an example, the anodic aluminum oxide structure according to the first exemplary embodiment of the present disclosure may be used in the semiconductor or display field. As a more specific example, the anodic aluminum oxide structure according to the first exemplary embodiment of the present disclosure may be used as a configuration of a guide plate 20 of a probe card PC in the semiconductor field. When used as the configuration of the guide plate 20, the anodic aluminum oxide structure according to the first exemplary embodiment of the present disclosure may have a through-hole for providing a probe therein.

In this case, the anodic aluminum oxide structure according to the first exemplary embodiment of the present disclosure may be composed of a plurality of anodic aluminum oxide sheets AS of the first embodiment. The anodic aluminum oxide structure according to the first exemplary embodiment of the present disclosure configured as above may have a structure in which the anodic aluminum oxide sheet AS of the first embodiment are joined on top of each other by a junction part. The junction part may be made of a photosensitive material, and preferably is a photosensitive film capable of lithography. Due to this characteristic of the junction part, after providing the junction part on at least one surface of each of the anodic aluminum oxide sheets AS of the first embodiment, at least a part of the junction part may be patterned by photolithography, and the anodic aluminum oxide sheet AS of the first embodiment is etched through a region from which the at least the part of the junction part has been removed by patterning, thereby forming through-holes.

In addition, the junction part may be a configuration that has bonding characteristics. Therefore, the anodic aluminum oxide sheets AS of the first embodiment each having the junction part on the at least one surface thereof may be joined to each other by the respective junction parts.

In a stacked structure of the plurality of anodic aluminum oxide sheets AS of the first embodiment, the anodic aluminum oxide structure according to the first exemplary embodiment of the present disclosure may have a surface formed by the barrier layer BL of each of the sheets.

For example, the anodic aluminum oxide sheets AS of the first embodiment may be composed of a first anodic aluminum oxide sheet, a second anodic aluminum oxide sheet, and a third anodic aluminum oxide sheet. Therefore, the anodic aluminum oxide structure according to the first exemplary embodiment of the present disclosure may be formed in a structure in which the second and third anodic aluminum oxide sheets are sequentially stacked on the first anodic aluminum oxide sheet. The first to third anodic aluminum oxide sheets may be joined to each other through the junction parts.

The anodic aluminum oxide structure according to the first exemplary embodiment of the present disclosure configured as above may have opposite surfaces formed by the first and third anodic aluminum oxide sheets. In this case, each of the first and third anodic aluminum oxide sheets may include the porous layer PL and the barrier layer BL, and the second anodic aluminum oxide sheet provided between the first and third anodic aluminum oxide sheets may include the porous layer PL and the barrier layer BL or only the porous layer PL.

Each of the first and third anodic aluminum oxide sheets may be configured so that a surface of each layer where each of the first and third anodic aluminum oxide sheets is positioned is formed by the barrier layer BL.

Specifically, the first anodic aluminum oxide sheet may have a structure in which the barrier layer BL is positioned under the porous layer PL. Therefore, a lower surface of the anodic aluminum oxide structure according to the first exemplary embodiment of the present disclosure may be formed by the barrier layer BL of the first anodic aluminum oxide sheet.

Meanwhile, the third anodic aluminum oxide sheet may have a structure in which the barrier layer BL is positioned on the porous layer PL. Therefore, an upper surface of the anodic aluminum oxide structure according to the first exemplary embodiment of the present disclosure may be formed by the barrier layer BL of the third anodic aluminum oxide sheet.

With such a structure, the anodic aluminum oxide structure according to the first exemplary embodiment of the present disclosure may have a uniform surface density. This may result in less warpage deformation due to heat under a high-temperature environment. Therefore, the anodic aluminum oxide structure according to the first exemplary embodiment of the present disclosure may be advantageously used in a device that is required to perform a process under a high-temperature atmosphere, such as the probe card PC.

In addition, the anodic aluminum oxide structure according to the first exemplary embodiment of the present disclosure may be formed in a closed structure by the barrier layers BL forming the surfaces thereof. With such a structure, the anodic aluminum oxide structure according to the first exemplary embodiment of the present disclosure may be prevented from experiencing a problem in which external particles are introduced into the structure.

When introduced into the anodic aluminum oxide structure, these particles may cause a problem of performance degradation.

However, since the anodic aluminum oxide structure according to the first exemplary embodiment of the present disclosure may be formed in a closed structure by the barrier layers BL forming the surfaces thereof, such a problem may be prevented.

Anodic Aluminum Oxide Structure According to a Second Exemplary Embodiment of the Present Disclosure The anodic aluminum oxide structure according to the first exemplary embodiment of the present disclosure may be formed in a structure that further increases the thicknesses b of the barrier layers BL forming the surfaces thereof, and thus may be implemented as an anodic aluminum oxide structure 10 according to the second exemplary embodiment of the present disclosure which will be described later. Specifically, the thickness b of the first barrier part BL1 described above may be increased.

Such a structure in which the thickness b of the barrier layer BL is increased may more effectively prevent warpage deformation under a high-temperature environment, and significantly improve surface strength.

The anodic aluminum oxide structure 10 according to the second exemplary embodiment of the present disclosure may be configured as a single anodic aluminum oxide structure in which an anodic aluminum oxide sheet AS' of a second embodiment forms the structure alone, and as a laminated anodic aluminum oxide structure in which a plurality of anodic aluminum oxide sheets AS' of the second embodiment are provided to form the structure.

Hereinafter, the anodic aluminum oxide structure 10 according to the second exemplary embodiment of the present disclosure will be described in detail with reference to FIGS. 3 to 5.

Figure 3:
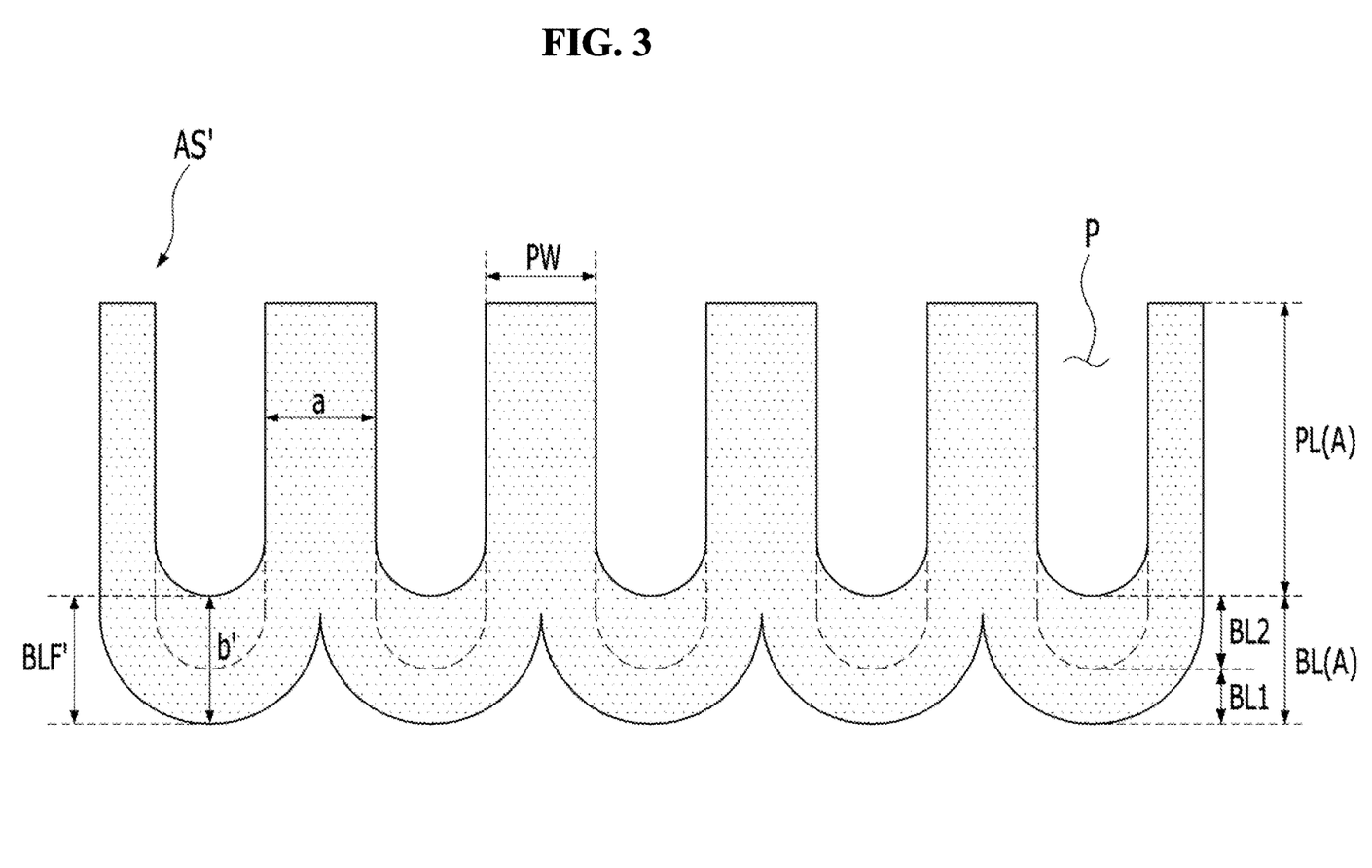
FIG. 3 is a view schematically illustrating an anodic aluminum oxide structure according to a second exemplary embodiment of the present disclosure.
Figure 4:
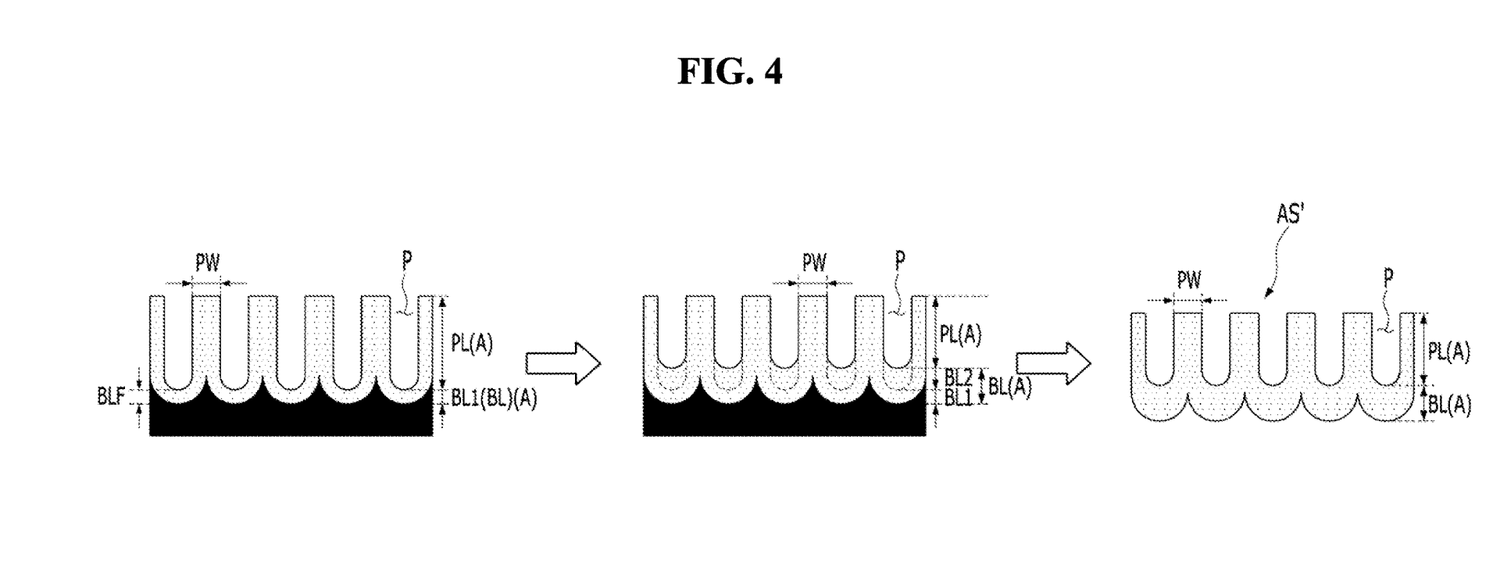
FIG. 4 is a view schematically illustrating a method of manufacturing the anodic aluminum oxide structure according to the second embodiment of the present disclosure.
Figure 5:
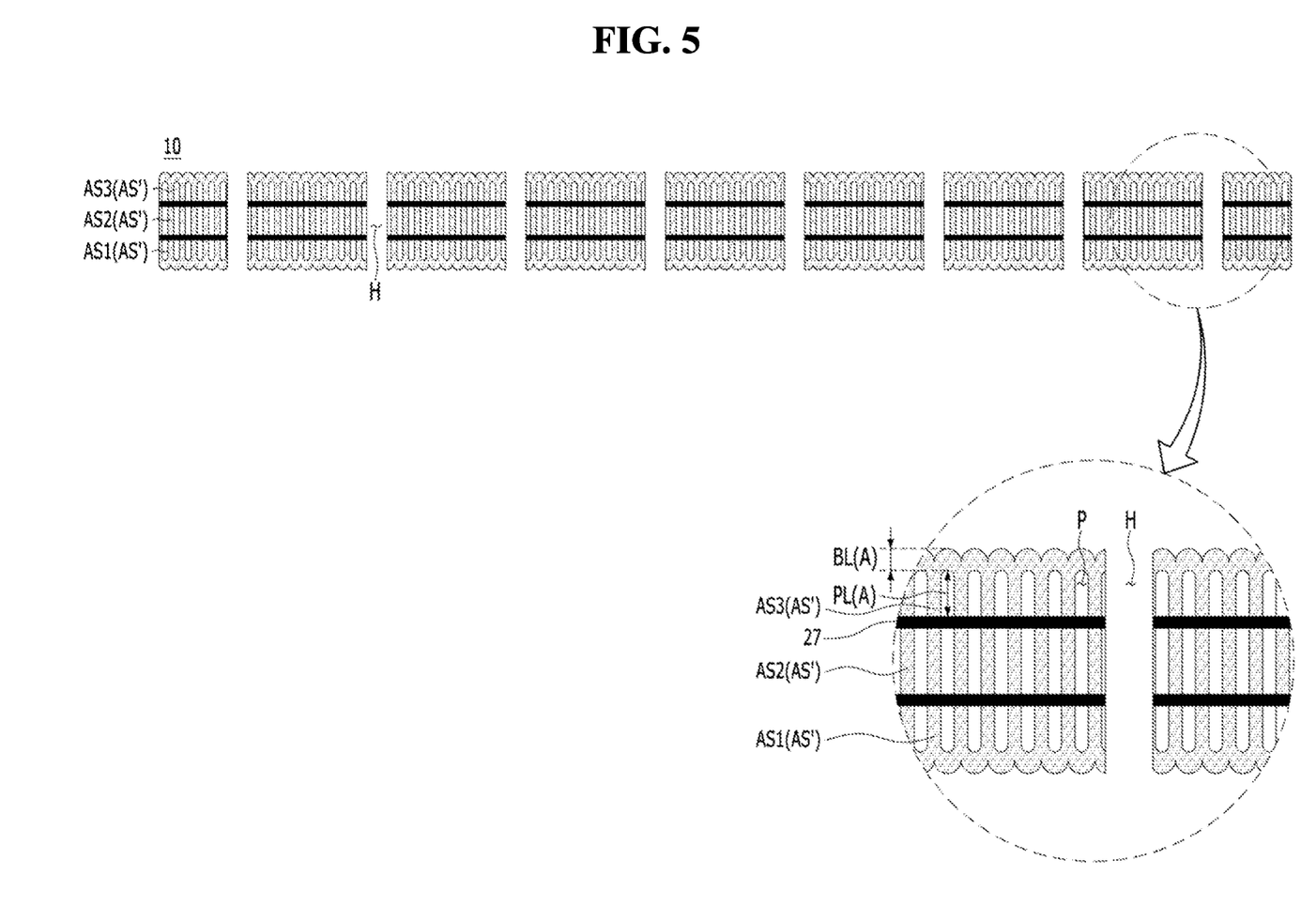
FIG. 5 is a view schematically illustrating the anodic aluminum oxide structure according to the second embodiment of the present disclosure implemented as a laminated anodic aluminum oxide structure.

FIG. 3 is an enlarged view illustrating at least a part of an anodic aluminum oxide sheet AS' of a second embodiment constituting the anodic aluminum oxide structure according to the second exemplary embodiment of the present disclosure, FIG. 4 is a view schematically illustrating a process of manufacturing the anodic aluminum oxide sheet AS' of the second embodiment constituting the anodic aluminum oxide structure according to the second exemplary embodiment of the present disclosure, and FIG. 5 is a view schematically illustrating an anodic aluminum oxide structure according to the second exemplary embodiment of the present disclosure implemented as a laminated anodic aluminum oxide structure.

The anodic aluminum oxide structure 10 according to the second exemplary embodiment of the present disclosure differs from the anodic aluminum oxide structure according to the first exemplary embodiment of the present disclosure in that a thickness b' of a barrier layer BL of the anodic aluminum oxide sheet AS' of the second embodiment is larger than a thickness a of a partition wall PW between each of pores P of a porous layer PL. Thus, in the following description of the anodic aluminum oxide structure 10 according to the second exemplary embodiment of the present disclosure, a characteristic configuration will be mainly described, and a description of the same configuration will be omitted.

As illustrated in FIGS. 3 and 4, the anodic aluminum oxide sheet AS' of the second embodiment constituting the anodic aluminum oxide structure 10 according to the second exemplary embodiment of the present disclosure may be configured so that the thickness b' of the barrier layer BL is larger than the thickness a of the partition wall PW between adjacent pores P of the porous layer PL.

The anodic aluminum oxide sheet AS' of the second embodiment constituting the anodic aluminum oxide structure according to the second exemplary embodiment of the present disclosure may be fabricated by an anodization process of a second embodiment as follows. A second barrier part BL2 may be formed continuously from a first barrier part BL1 by the anodization process of the second embodiment, while being charged in at least a part of each of the pores P of the porous layer PL. The barrier layer BL may be formed to include the first barrier part BL1 and the second barrier part BL2 by the anodization process of the second embodiment. This will be described in detail with reference to FIG. 4.

The anodic aluminum oxide sheet AS' of the second embodiment may be fabricated by: performing the anodization process of the first embodiment on an electropolished aluminum base material BM so that anodic aluminum oxide A including the barrier layer BL having the first barrier part BL1 and the porous layer PL is formed on a surface of the aluminum base material BM; and performing the anodization process of the second embodiment without removing the aluminum base material BM.

As illustrated in FIG. 4, the anodization process of the second embodiment may be performed on the aluminum base material BM on which the anodic aluminum oxide A including the barrier layer BL having the first barrier part BL1 and the porous layer PL is formed by the anodization process of the first embodiment.

The anodization process of the second embodiment may be a process of forming the second barrier part BL2 which is continuously formed from the first barrier part BL1 to increase an overall thickness b' of the barrier layer BL. In this case, the barrier layer BL may be formed to have a larger thickness b' than the thickness a of the partition wall between each of the pores P. In the anodization process of the second embodiment, a second electrolyte solution may be used. The second electrolyte solution may include an aqueous citric acid solution. Hereinafter, the anodization process of the second embodiment is performed using the aqueous citric acid solution.

The aqueous citric acid solution is an electrolyte solution that does not dissolve the anodic aluminum oxide A formed by the anodization process of the first embodiment. In this case, the pH of the aqueous citric acid solution is preferably equal to or greater than pH 5, and more preferably pH 7.3.

More specifically, the aluminum base material BM on which the anodic aluminum oxide A including the barrier layer BL having the first barrier part BL1 and the porous layer PL is formed by the anodization process of the first embodiment is immersed in an electrolytic bath containing the aqueous citric acid solution. In this case, the pH of the aqueous citric acid solution is, for example, pH 7.3, and the voltage applied to the electrolytic bath is increased from 20 V to 300 V with a constant current of 10 mA/cm$^2$.

As illustrated in FIG. 4, by the anodization process of the second embodiment, the second barrier part BL2 may be formed continuously from the first barrier part BL1 produced by the anodization process of the first embodiment, and may grow while being charged in at least a part of adjacent pores P of the porous layer PL. Therefore, the anodic aluminum oxide A formed by the anodization process of the second embodiment may have a presence region of the barrier layer BL, the presence region being larger than that of the anodic aluminum oxide A formed by the anodization process of the first embodiment.

In other words, a barrier layer presence region BLF' of the anodic aluminum oxide A formed by the anodization process of the second embodiment may be larger than a barrier layer presence region BLF of the anodic aluminum oxide A formed by the anodization process of the first embodiment.

Then, as illustrated in FIG. 4, in a state in which the anodic aluminum oxide A having the barrier layer BL of large thickness b' and the porous layer PL is formed on the surface of the aluminum base material BM by the anodization process of the second embodiment, when the aluminum base material BM is removed, only the anodic aluminum oxide A consisting of aluminum oxide ($Al_2O_3$) remains.

As such, the anodic aluminum oxide sheet AS' of the second embodiment may be fabricated by performing the anodization process of the second embodiment on the aluminum base material BM having been subjected to the anodization process of the first embodiment. Therefore, the anodic aluminum oxide sheet AS' of the second embodiment may have the barrier layer BL having the thickness b' larger than the thickness b of the barrier layer BL of the anodic aluminum oxide sheet AS of the first embodiment.

Meanwhile, in the barrier layer BL of the anodic aluminum oxide sheet AS', the second barrier part BL2 may be formed by depositing a ceramic material (alumina, nitride, etc.) on a surface of the first barrier part BL1 formed by the anodization process of the first embodiment, instead of a separate barrier layer growth process.

Specifically, an atomic deposition layer may be formed on the surface of the first barrier part BL1 formed by the anodization process of the first embodiment by an atomic layer deposition (ALD) method. The atomic deposition layer may be formed by: removing the aluminum base material BM in a state in which the aluminum base material BM on which the barrier layer BL having the first barrier part BL1 is formed by the anodization process of the first embodiment; and performing the ALD method on the surface of the first barrier part BL1. The atomic deposition layer may be made of at least one of aluminum oxide ($Al_2O_3$), yttrium oxide ($Y_2O_3$), and aluminum nitride (AlN).

By providing the atomic deposition layer on the surface of the first barrier part BL1, the anodic aluminum oxide sheet AS' may improve surface strength.

As illustrated in FIGS. 3 and 4, in the anodic aluminum oxide sheet AS' of the second embodiment, the barrier layer BL may be formed to have a larger thickness b' than the thickness a of the partition wall PW between each of the pores P of the porous layer PL by the anodization process of the second embodiment.

Due to the thickness b' larger than the thickness b of the barrier layer BL of the anodic aluminum oxide sheet AS of the first embodiment, the anodic aluminum oxide sheet AS' of the second embodiment may have a barrier layer BL with enhanced strength BL. Therefore, the anodic aluminum oxide structure 10 according to the second exemplary embodiment of the present disclosure may have a relatively higher surface strength than the anodic aluminum oxide structure according to the first exemplary embodiment of the present disclosure.

As illustrated in FIG. 5, the anodic aluminum oxide structure 10 according to the second exemplary embodiment of the present disclosure may be composed of a plurality of anodic aluminum oxide sheets AS' of the second embodiment.

The anodic aluminum oxide sheets AS' of the second embodiment may be composed of a first anodic aluminum oxide sheet AS1, a second anodic aluminum oxide sheet AS2, and a third anodic aluminum oxide sheet AS3. The anodic aluminum oxide structure 10 according to the second exemplary embodiment of the present disclosure may be formed in a structure in which the second and third anodic aluminum oxide sheets AS2 and AS3 are sequentially stacked on the first anodic aluminum oxide sheet AS1.

The first to third anodic aluminum oxide sheets AS1, AS2, and AS3 may be joined to each other through respective junction parts 27.

In this case, each of the junction parts 27 may be made of a photosensitive material. Preferably, the junction part 27 is a photosensitive film capable of photolithography, and at the same time may have a configuration that has bonding properties. That is, the junction part 7 may simultaneously have both the photosensitive properties and bonding properties.

In this case, the junction part 7 may be provided on at least one surface of the anodic aluminum oxide sheet AS' of the second embodiment. As illustrated in FIG. 5, in the anodic aluminum oxide structure 10 according to the second exemplary embodiment of the present disclosure, as an example, the junction part 27 may be provided on an upper surface of each of the first anodic aluminum oxide sheet AS1 and the second anodic aluminum oxide sheet AS2.

The first anodic aluminum oxide sheet AS1 may have the barrier layer BL on a lower surface thereof on which the junction part 27 is not provided. The porous layer PL of the first anodic aluminum oxide sheet AS1 may be provided between the junction part 27 and the barrier layer BL.

At least a part of the junction part 27 provided on the lower surface of the first anodic aluminum oxide sheet AS1 may be patterned by photolithography. Then, the first anodic aluminum oxide sheet AS1 may be etched through a region from which the at least the part of the junction part 27 has been removed by patterning, thereby forming through-holes H. When the anodic aluminum oxide structure 10 according to the second exemplary embodiment of the present disclosure is used as a configuration of a guide plate 20, each of the through-holes H may function as a guide hole for allowing insertion of a probe therein.

When the anodic aluminum oxide A is wet-etched with an etchant, the through-holes H each having a vertical inner wall may be formed, and each of the through-holes H may have the same shape and size as the region from which the at least the part of the junction part 27 has been removed by patterning, the region being an opening region of the photosensitive material. As a result, the first anodic aluminum oxide sheet AS1 may have the through-holes H with a fine size and pitch.

As illustrated in FIG. 5, the second anodic aluminum oxide sheet AS2 may be an internal anodic aluminum oxide sheet provided between the first and third anodic aluminum oxide sheets AS1 and AS3. In this case, the second anodic aluminum oxide sheet AS2 may be made of anodic aluminum oxide A including the barrier layer BL and the porous layer PL, or anodic aluminum oxide A including only the porous layer PL. That is, the internal anodic aluminum oxide sheet may be made of the anodic aluminum oxide A including the barrier layer BL and the porous layer, or the anodic aluminum oxide A including only the porous layer PL.

The second anodic aluminum oxide sheet AS2 may be joined onto the first anodic aluminum oxide sheet AS1 by the junction part 27 provided on the upper surface of the first anodic aluminum oxide sheet AS1.

After the junction part 27 is provided on the upper surface of the second anodic aluminum oxide sheet AS2, through-holes H may be formed in the second anodic aluminum oxide sheet AS2 in the same manner as the method of forming the through-holes H of the first anodic aluminum oxide sheet AS1. In this case, the through-holes H of the first and second anodic aluminum oxide sheets AS1 and AS2 may be formed at positions corresponding to each other.

The third anodic aluminum oxide sheet AS3 may be joined onto the second anodic aluminum oxide sheet AS2 by the junction part 27 provided on the upper surface of the second anodic aluminum oxide sheet AS2. The third anodic aluminum oxide sheet AS3 may be adhered on a lower surface thereof to the junction part 27 of the second anodic aluminum oxide sheet AS2, and may have the barrier layer BL on an upper surface thereof remaining unadhered.

Through-holes H may be formed in the third anodic aluminum oxide sheet AS3 in the same manner as the method of forming the through-holes H of the first and second anodic aluminum oxide sheets AS1 and AS2. In this case, the through-holes H may be formed at positions corresponding to the through-holes H of the first and second anodic aluminum oxide sheets AS1 and AS2.

The anodic aluminum oxide structure 10 according to the second exemplary embodiment of the present disclosure may be formed in a structure in which the first to third anodic aluminum oxide sheets AS1, AS2, and AS3 configured as above are stacked. Therefore, as illustrated in FIG. 5, the anodic aluminum oxide structure 10 according to the second exemplary embodiment of the present disclosure may have a structure in which opposite surfaces thereof are formed by the barrier layers BL of the first and third anodic aluminum oxide sheets AS1 and AS3, so that the barrier layers BL are symmetrical to each other.

The anodic aluminum oxide structure 10 according to the second exemplary embodiment of the present disclosure may have a uniform surface density by the barrier layers BL forming the surfaces thereof. In this case, the barrier layers BL constituting the surfaces of the anodic aluminum oxide structure 10 according to the second exemplary embodiment of the present disclosure have overall thicknesses b' larger than those of the barrier layers BL forming the surfaces of the anodic aluminum oxide structure according to the first exemplary embodiment of the present disclosure.

In other words, the anodic aluminum oxide structure 10 according to the second exemplary embodiment of the present disclosure may have a structure in which the thicknesses of the barrier layers BL forming the surfaces thereof are increased.

Therefore, the anodic aluminum oxide structure 10 according to the second exemplary embodiment of the present disclosure may have a more improved surface strength, and may be more effectively prevented from experiencing warpage deformation under a high-temperature environment.

In addition, by providing the barrier layers BL having large thicknesses, when used as the configuration of the guide plate 20 of the probe card 20, the anodic aluminum oxide structure 10 according to the second exemplary embodiment of the present disclosure may be prevented from experiencing particle being generated during probe insertion, as well as the above problem of warpage deformation under a high-temperature environment.

Anodic Aluminum Oxide Structure According to a Third Exemplary Embodiment of the Present Disclosure The anodic aluminum oxide structure according to the third exemplary embodiment of the present disclosure may be formed in a structure in which the anodic aluminum oxide structure according to the first exemplary embodiment of the present disclosure configured as the laminated anodic aluminum oxide structure and the anodic aluminum oxide structure according to the second exemplary embodiment of the present disclosure configured as the laminated anodic aluminum oxide structure are combined.

The anodic aluminum oxide structure according to the third exemplary embodiment of the present disclosure may be configured so that the anodic aluminum oxide structure according to the second exemplary embodiment of the present disclosure configured as the single anodic aluminum oxide structure is provided at the outermost side thereof, and the anodic aluminum oxide structure according to the first exemplary embodiment of the present disclosure configured as the laminated anodic aluminum oxide structure is provided at the innermost side thereof. In this case, the anodic aluminum oxide structure according to the first exemplary embodiment of the present disclosure provided at the innermost side may be configured as the single anodic aluminum oxide structure. However, in order to more effectively improve the overall durability of the anodic aluminum oxide structure according to the third exemplary embodiment of the present disclosure, preferably, the anodic aluminum oxide structure according to the first exemplary embodiment of the present disclosure configured as the laminated anodic aluminum oxide structure is provided at the innermost side.

In other words, the anodic aluminum oxide structure according to the third exemplary embodiment of the present disclosure may have a structure in which each of opposite surfaces thereof is formed by the barrier layer BL of the anodic aluminum oxide sheet AS' of the second embodiment provided at the outermost side, so that the respective barrier layers BL are symmetrical to each other. The anodic aluminum oxide structure according to the first exemplary embodiment of the present disclosure configured as the single anodic aluminum oxide structure or the laminated anodic aluminum oxide structure may be provided at the innermost side.

The anodic aluminum oxide structure according to the third exemplary embodiment of the present disclosure may be formed in a structure in which, between the respective outermost anodic aluminum oxide sheets AS' of the second embodiment forming the surfaces thereof, the anodic aluminum oxide structure according to the first exemplary embodiment of the present disclosure configured as the single or laminated anodic aluminum oxide structure is interposed.

In other words, the anodic aluminum oxide structure according to the third exemplary embodiment of the present disclosure may be formed in a structure in which between outermost anodic aluminum oxide structures 10 according to the second exemplary embodiment of the present disclosure configured as single aluminum oxide structures, the anodic aluminum oxide structure according to the first exemplary embodiment of the present disclosure configured as the single or laminated anodic aluminum oxide structure is interposed.

With such a structure, the anodic aluminum oxide structure according to the third exemplary embodiment of the present disclosure may have the surfaces formed by the barrier layers BL having large thicknesses b'. This may improve surface strength, and effectively prevent warpage deformation due to heat under a high-temperature atmosphere.

The anodic aluminum oxide structures 10 according to the second exemplary embodiment of the present disclosure, which ensure a high degree of surface strength, prevention of warpage deformation due to high-temperature heat, and a high degree of abrasion resistance of the inner walls of openings of the through-holes H, may be provided as the single anodic aluminum oxide structures to form the surfaces of the anodic aluminum oxide structure according to the third exemplary embodiment of the present disclosure, so that the anodic aluminum oxide structure according to the third exemplary embodiment of the present disclosure may exhibit the same effect as that of the anodic aluminum oxide structure 10 according to the second exemplary embodiment of the present disclosure.

In addition, the anodic aluminum oxide structure according to the first exemplary embodiment of the present disclosure, which may be rapidly fabricated by performing only the anodization process of the first embodiment, may be provided at the innermost side. Therefore, the anodic aluminum oxide structure according to the third exemplary embodiment of the present disclosure may have a structure with significantly improved overall durability by combining the anodic aluminum oxide structures according to the first and second exemplary embodiments of the present disclosure, and may be produced relatively quickly and efficiently.

Figure 6:
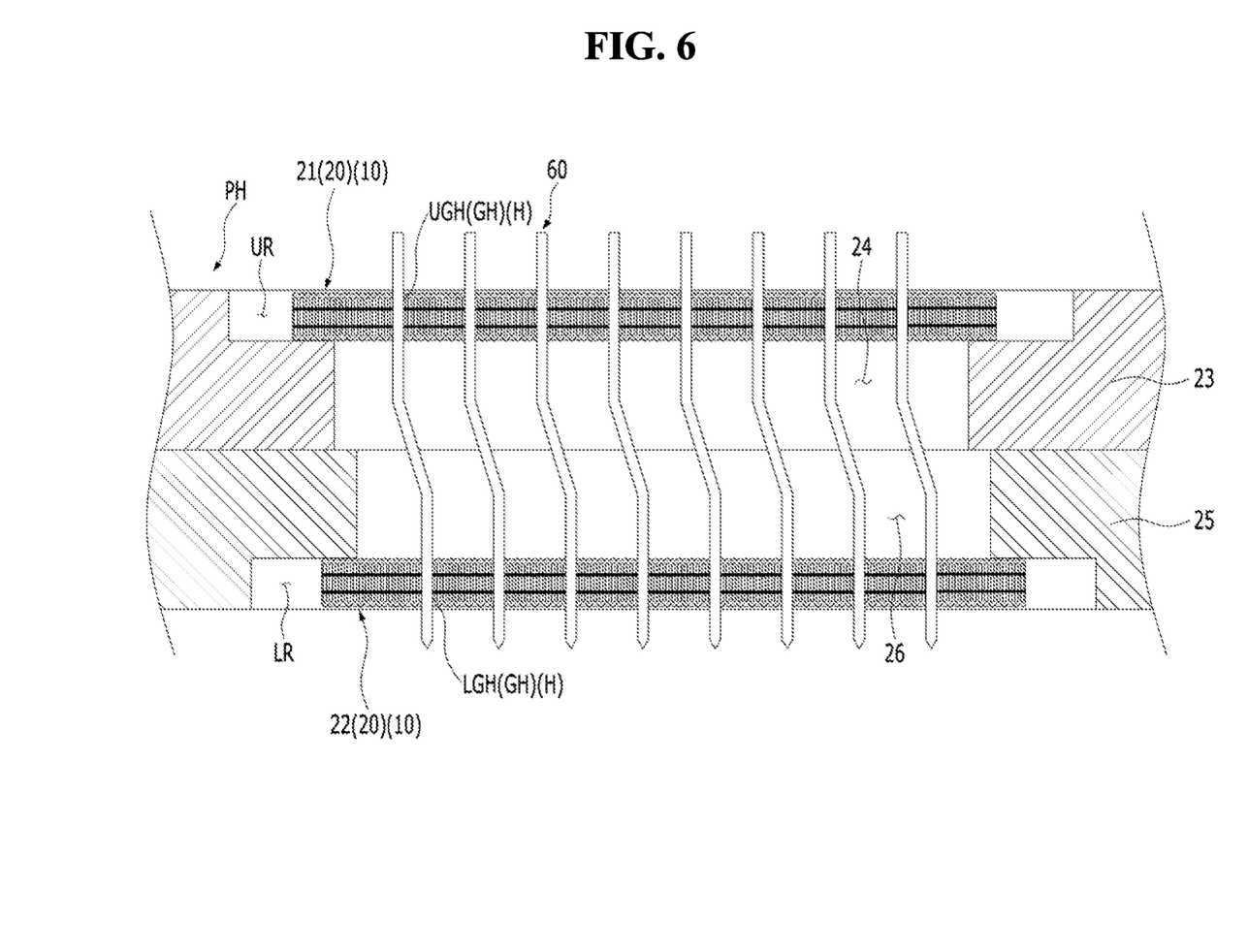
FIG. 6 is an enlarged view illustrating a probe head including the anodic aluminum oxide structure according to at least one of the first to third embodiments of the present disclosure.
Figure 7:
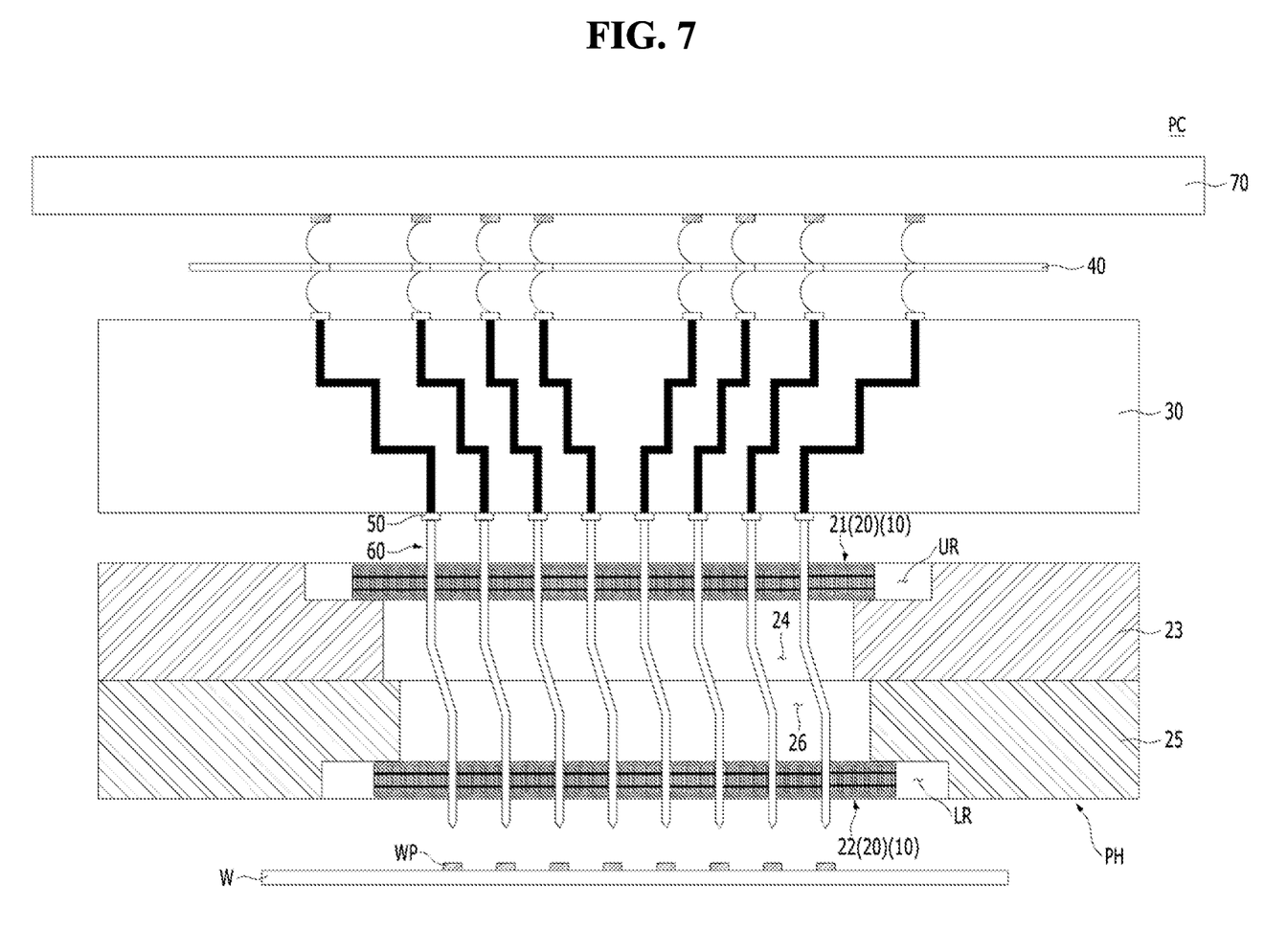
FIG. 7 is a schematic view illustrating a probe card including the probe head illustrated in FIG. 6.

Probe Head According to an Exemplary Embodiment of the Present Disclosure and Probe Card Having the Same According to an Exemplary Embodiment of the Present Disclosure FIG. 6 is a view schematically illustrating a probe head PH constituting a probe card PC according to an exemplary embodiment of the present disclosure, the probe card having the anodic aluminum oxide structure according to at least one of the first to third exemplary embodiments of the present disclosure as a configuration of a guide plate 20, and FIG. 7 is a view schematically illustrating a probe card PC according to an exemplary embodiment of the present disclosure including a probe head PH having the anodic aluminum oxide structure according to at least one of the first to third exemplary embodiments of the present disclosure.

Although FIGS. 6 and 7 each illustrate an example that the anodic aluminum oxide structure 10 according to the second exemplary embodiment of the present disclosure is provided, the anodic aluminum oxide structure according to the first exemplary embodiment or the third exemplary embodiment of the present disclosure may be provided.

Depending on the structure of installing a probe 60 on a wiring substrate and the structure of the probe 60, the probe card PC may be divided into a vertical type probe card, a cantilever type probe card, a micro-electro-mechanical system (MEMS) probe card.

As illustrated in FIGS. 6 and 7, the anodic aluminum oxide structure according to at least one of the first to third exemplary embodiments of the present disclosure may be, as an example, provided as a configuration of the guide plate 20 of the probe head PH constituting the vertical type probe card PC.

As illustrated in FIG. 7, the probe card PC according to the exemplary embodiment of the present disclosure may include a space transformer 30 having a probe connection pad 50 electrically connected to each of a plurality of probes 60, an interposer 40 electrically connecting the space transformer 30 and a circuit board 70 at a position between the space transformer 30 and the circuit board 70, and the probe head PH provided below the space transformer 30.

As illustrated in FIG. 7, the probe head PH constituting the probe card PC according to the exemplary embodiment of the present disclosure includes the guide plate 20 and is provided below the space transformer 30.

As illustrated in FIGS. 6 and 7, the probe head PH constituting the probe card PC according to the exemplary embodiment of the present disclosure may include first and second plates 23 and 25, the guide plate 20 including an upper guide plate 21 having an upper guide hole UGH and a lower guide plate 22 having a lower guide hole LGH, and the plurality of probes 60.

The structure of the probe head PH constituting the probe card PC according to the exemplary embodiment of the present disclosure is as follows.

As illustrated in FIGS. 6 and 7, the probe head PH may be formed in a structure in which the second plate 25 is provided under the first plate 23. In this case, the first plate 23 may include an upper seating region UR for providing the upper guide plate 21, and the second plate 25 may include a lower seating region LR for providing the lower guide plate 22.

The upper seating region UR may be formed on an upper side of the first plate 23 to allow the upper guide plate 21 to be provided therein. In addition, the lower seating region LR may be formed on a lower side of the second plate 25 to allow the lower guide plate 22 to be provided therein. The upper seating region UR and the lower seating region LR may have the same size and shape.

The first plate 23 may have a first through-hole 24 formed in a lower portion of the upper seating region UR, and the second plate 25 may have a second through-hole 26 formed in an upper portion of the lower seating region LR.

The first and second through-holes 24 and 26 may be provided to allow the plurality of probes 60 inserted through the upper and lower guide holes UGH and LGH, which will be described later, to be positioned therein. Therefore, the first and second through-holes 24 and 26 may be formed with an inner diameter that can accommodate elastic deformation of the plurality of probes 60.

The upper guide plate 21 and the lower guide plate 22 may be formed in shapes corresponding to each other, and may include the same configuration (e.g., a guide hole GH for allowing insertion of each of the plurality of probes 60).

At least one of the upper guide plate 21 and the lower guide plate 22 may be composed of at least one of the anodic aluminum oxide sheets of the first to third exemplary embodiments of the present disclosure.

As illustrated in FIG. 6, the anodic aluminum oxide sheet AS' may include the porous layer PL including the pores P and the barrier layer BL provided on at least one surface of the porous layer PL and including no pores P.

The at least one of the upper guide plate 21 and the lower guide plate 22 may be formed by stacking the plurality of anodic aluminum oxide sheets AS'.

Specifically, in the probe head PH constituting the probe card PC according to the exemplary embodiment of the present disclosure, the guide plate 20 may be configured by the anodic aluminum oxide structures according to the first to third exemplary embodiments of the present disclosure. Therefore, the guide plate 20 may have a structure in which the plurality of anodic aluminum oxide sheets AS' are stacked.

Each of the anodic aluminum oxide sheets AS' may have a coefficient of thermal expansion similar to that of a wafer W. Therefore, the anodic aluminum oxide sheets AS' may have less thermal deformation due to heat under a high-temperature atmosphere. This may enable, when the probe card PC according to the exemplary embodiment of the present disclosure performs a burn-in test to ensure reliability of a chip, the probe card PC to undergo minimized thermal deformation due to heat under a high-temperature environment. As a result, the anodic aluminum oxide structures according to the first to third exemplary embodiments of the present disclosure may be prevented from experiencing a problem in which the positions of the through-holes H are deformed. This may also prevent a problem in which positional accuracy of the probes 60 provided in the through-holes H with respect to electrode pads WP of the wafer W is deteriorated.

In addition, the anodic aluminum oxide sheets AS' may be made of anodic aluminum oxide A having light-transmitting properties, so that a problem in which positioning accuracy of the upper and lower guide holes UGH and LGH is deteriorated may be prevented.

In addition, the anodic aluminum oxide sheets AS' having transparency may facilitate an insertion process of the plurality of probes 60. Each of the plurality of probes 60 may sequentially pass through the upper guide hole UGH and the lower guide hole LGH and protrude toward the wafer W. In this case, the plurality of probes 60 may be easily inserted into the respective upper and lower guide holes UGH and LGH due to the light-transmitting properties of the anodic aluminum oxide sheets AS'.

A related-art ceramic guide plate is not a light-transmitting material, and thus is difficult for an operator to manually insert probes. This may cause a problem in which the overall efficiency of a manufacturing process of a probe card is deteriorated.

However, in the probe head PH constituting the probe card PC according to the exemplary embodiment of the present disclosure, such a problem may be solved by providing the anodic aluminum oxide structures according to the first to third exemplary embodiments of the present disclosure as configurations of the guide plate 20.

More specifically, in the probe head PH constituting the probe card PC according to the exemplary embodiment of the present disclosure, the probes 60 may be provided in such a manner that front ends of the probes 60 are firstly inserted into the upper guide holes UGH of the upper guide plate 21 and then into the lower guide holes LGH of the lower guide plate 22. In this case, the positions of the upper guide holes UGH and the lower guide holes LGH may be accurately identified with the naked eyes due to the light-transmitting properties of the anodic aluminum oxide sheets AS'. This may facilitate the sequential insertion of the probes 60 from the upper guide holes UGH into which the front ends thereof are inserted and into the lower guide holes LGH positioned correspondingly to the upper guide holes UGH.

In addition, in the probe head PH constituting the probe card PC according to the exemplary embodiment of the present disclosure, a problem in which particles are generated during the insertion of the probes 60 may be prevented by providing the anodic aluminum oxide structures according to the first to third exemplary embodiments of the present disclosure as configurations of the guide plate 20.

In particular, the anodic aluminum oxide structure 10 according to the second exemplary embodiment of the present disclosure may have the surfaces formed by the barrier layers BL having large thicknesses b' by the anodization process of the second embodiment. In other words, the surfaces of the anodic aluminum oxide structure 10 according to the second exemplary embodiment of the present disclosure may have a structure in which the barrier layers BL having large thicknesses b' are symmetrical to each other. Therefore, the inner walls of openings of the through-holes H may be formed by the barrier layers BL having a high degree of density, thus having a high degree of durability. This may prevent abrasion of the inner walls of openings of the respective guide holes GH that may occur simultaneously with the insertion of the probes 60.

In the case of the guide plate 20, when the probes 60 are inserted through the guide holes GH, as friction occurs between the guide holes GH and the front ends of the probes 60, abrasion may occur on the inner walls thereof. In this process, particles may be generated, and these particles may be introduced into the guide plate 20 to cause a problem of deteriorating the overall performance of the probe head PH.

However, in the anodic aluminum oxide structure 10 according to the second exemplary embodiment of the present disclosure, the thicknesses b' of the barrier layers BL may be increased by the anodization process of the second embodiment. Therefore, durability of the inner walls of the openings of the through-holes H may be significantly improved. When the anodic aluminum oxide structure 10 according to the second exemplary embodiment of the present disclosure functions as a configuration of the guide plate 20, the through-holes H may function as the guide holes GH for allowing insertion of the probes 60 therein. That is, a high degree of durability may be ensured due to the barrier layer BL of large thickness b' forming the inner walls of the openings of the guide-holes GH. As a result, the problem may be prevented in which particles are generated by friction between the inner walls of the openings of the guide holes GH and the front ends of the probes 60 during the insertion of the probes 60 into the guide holes GH.

In addition, due to the barrier layer BL having large thickness b', the anodic aluminum oxide structure 10 according to the second exemplary embodiment of the present disclosure may have excellent abrasion resistance in terms of sliding friction between the through-holes H and the probes 60.

The plurality of probes 60 may be manufactured in a vertical shape and may be inserted into the upper and lower guide-holes UGH and LGH. Then, at least one of the first and second plates 23 and 25 may be moved so that their positions are shifted from each other. Then, the first and second plates 23 and 25 may be coupled to each other in the shifted state. As a coupling means for the first and second plates 23 and 25, a bolt may be used as an example, but the present disclosure is not limited thereto. Therefore, each of the probes 60 may have a structure in which an intermediate portion thereof is elastically deformed.

In the probe head PH constituting the probe card PC according to the exemplary embodiment of the present disclosure, warpage deformation due to heat under a high-temperature environment may be effectively prevented by using the anodic aluminum oxide structure 10 according to the second exemplary embodiments of the present disclosure as a configuration of the guide plate 20.

The anodic aluminum oxide structure 10 according to the second exemplary embodiment of the present disclosure differs from the anodic aluminum oxide structure according to the first exemplary embodiment of the present disclosure in that the barrier layer BL includes the first barrier part BL1 and the second barrier part BL2.

More specifically, the anodic aluminum oxide structures according to the first and second exemplary embodiments of the present disclosure have a difference in the overall thickness b and b' of the barrier layers BL, and all configurations except for this remain the same. Therefore, the anodic aluminum oxide structure according to the first exemplary embodiment of the present disclosure may be provided in a configuration including the anodic aluminum oxide structure 10 according to the second exemplary embodiment of the present disclosure. However, the barrier layer BL formed by the anodization process of the second embodiment may have a higher degree of surface strength than the barrier layer BL formed by the anodizing process of the first embodiment due to its large thickness b'. That is, the anodic aluminum oxide structure according to the first and second exemplary embodiments of the present disclosure remain the same in that surface strength is secured by the barrier layer BL, but the degree of surface strength may be different due to the difference in that the thickness b' is larger than the thickness b.

In addition, warpage deformation due to heat under a high-temperature environment may be more effectively prevented. Therefore, in a device (e.g., the probe card PC according to the exemplary embodiment of the present disclosure) that requires prevention of warpage deformation due to high-temperature heat and excellent surface strength, preferably, the anodic aluminum oxide structure 10 according to the second exemplary embodiment of the present disclosure is provided.

In other words, the anodic aluminum oxide structure according to the first and second exemplary embodiments of the present disclosure may have the same configuration and structure to exhibit the same effect, but the effect may be further maximized due to the difference in the thicknesses b and b' of the barrier layers BL. Therefore, the anodic aluminum oxide structures according to the first and second exemplary embodiments of the present disclosure may be suitably provided in consideration of the process environment (e.g., temperature and required surface strength) of a device having the same.

The probe head PH constituting the probe card PC according to the exemplary embodiment of the present disclosure is required to secure abrasion resistance of the inner walls of the openings of the guide holes GH of the guide plate 20 with respect to the front ends of the probes 60.

In addition, the probe card PC according to the exemplary embodiment of the present disclosure may be mainly processed under a high-temperature environment. Therefore, a structure in which warpage deformation due to heat is prevented under a high-temperature environment may be required.

The anodic aluminum oxide structure 10 according to the second exemplary embodiment of the present disclosure may have excellent abrasion resistance due to the barrier layer BL of large thickness b' forming the inner walls of the openings of the through-holes H.

In addition, due to the large thickness b' of the barrier layer BL having a high degree of density, the anodic aluminum oxide structure 10 according to the second exemplary embodiment of the present disclosure may be more effectively prevented from experiencing warpage deformation under a high-temperature environment.

Therefore, the anodic aluminum oxide structure 10 according to the second exemplary embodiment of the present disclosure may more effectively achieve the purpose required of the probe head PH constituting the probe card PC according to the exemplary embodiment of the present disclosure.

Thus, as the configuration of the guide plate 20 of the probe head PH of the probe card PC according to the exemplary embodiment of the present disclosure, the anodic aluminum oxide structure 10 according to the second exemplary embodiment of the present disclosure is preferably provided.

In addition, the anodic aluminum oxide structure 10 according to the second exemplary embodiment of the present disclosure may facilitate the insertion of the probes 60 into the through-holes H due to light-transmitting properties of the anodic aluminum oxide A constituting the same. Although the anodic aluminum oxide structure 10 according to the second exemplary embodiment of the present disclosure may have the barrier layer BL of large thickness b' forming the surface, light-transmitting properties may be maintained. Therefore, the anodic aluminum oxide structure 10 according to the second exemplary embodiment of the present disclosure may be used as a configuration of the guide plate 20 that has excellent surface strength and facilitates the insertion of the probes 60.

As described above, the present disclosure has been described with reference to the exemplary embodiments. However, those skilled in the art will appreciate that various modifications, additions and substitutions are possible, without departing from the scope and spirit of the present disclosure as disclosed in the accompanying claims.

What is claimed is:

1. A probe head, comprising:
   an upper guide plate having an upper guide hole; and
   a lower guide plate having a lower guide hole,
   wherein at least one of the upper guide plate and the lower guide plate is composed of an anodic aluminum oxide sheet,
   wherein the anodic aluminum oxide sheet comprises:
     a porous layer having pores,
     a barrier layer provided on at least one surface of the porous layer and having no pores, and
     a plurality of through-holes provided through the porous layer and the barrier layer,
     wherein a thickness of the barrier layer is larger than that of a partition wall between adjacent pores of the porous layer, and
     wherein each of a plurality of probes passes through each of the plurality of through-holes as at least one of the upper guide hole and the lower guide hole.

2. The probe head of claim 1, wherein the at least one of the upper guide plate and the lower guide plate is formed by stacking a plurality of anodic aluminum oxide sheets.

3. The probe head of claim 2, wherein the anodic aluminum oxide sheets are joined to each other by a junction part.

4. The probe head of claim 3, wherein the junction part is a photosensitive film capable of lithography.

5. A probe card, comprising:
   a space transformer having a probe connection pad electrically connected to each of a plurality of probes; and
   a probe head provided below the space transformer,
   wherein the probe head comprises:
   an upper guide plate having an upper guide hole; and
   a lower guide plate having a lower guide hole,
   wherein at least one of the upper guide plate and the lower guide plate is composed of an anodic aluminum oxide sheet, and
   wherein the anodic aluminum oxide sheet comprises:
     a porous layer having pores,
     a barrier layer provided on at least one surface of the porous layer and having no pores, and
     a plurality of through-holes provided through the porous layer and the barrier layer,
     wherein a thickness of the barrier layer is larger than that of a partition wall between adjacent pores of the porous layer, and
     wherein each of a plurality of probes passes through each of the plurality of through-holes as at least one of the upper guide hole and the lower guide hole.

6. An anodic aluminum oxide structure, comprising:
   an anodic aluminum oxide sheet including:
     a porous layer having pores,
     a barrier layer provided on at least one surface of the porous layer and having no pores, and
     a plurality of through-holes provided through the porous layer and the barrier layer,
     wherein a thickness of the barrier layer is larger than that of a partition wall between adjacent pores of the porous layer.

\* \* \* \* \*